(12) United States Patent
Wen

(10) Patent No.: US 9,373,600 B2
(45) Date of Patent: Jun. 21, 2016

(54) PACKAGE SUBSTRATE STRUCTURE FOR ENHANCED SIGNAL TRANSMISSION AND METHOD

(71) Applicant: Semiconductor Components Industries, LLC, Phoenix, AZ (US)

(72) Inventor: Yenting Wen, Chandler, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/551,277

(22) Filed: Nov. 24, 2014

(65) Prior Publication Data

US 2015/0214173 A1 Jul. 30, 2015

Related U.S. Application Data

(60) Provisional application No. 61/931,958, filed on Jan. 27, 2014.

(51) Int. Cl.

| | |
|---|---|
| *H01L 23/00* | (2006.01) |
| *H01L 23/522* | (2006.01) |
| *H01L 23/48* | (2006.01) |
| *H01L 23/498* | (2006.01) |
| *H01L 21/768* | (2006.01) |
| *H01L 23/538* | (2006.01) |
| *H01L 23/31* | (2006.01) |

(52) U.S. Cl.
CPC .............. *H01L 24/17* (2013.01); *H01L 23/481* (2013.01); *H01L 23/4985* (2013.01); *H01L 23/49822* (2013.01); *H01L 23/49838* (2013.01); *H01L 23/5226* (2013.01); *H01L 24/81* (2013.01); *H01L 21/76805* (2013.01); *H01L 23/3128* (2013.01); *H01L 23/49816* (2013.01); *H01L 23/5384* (2013.01); *H01L 2224/0401* (2013.01); *H01L 2224/05025* (2013.01); *H01L 2224/16235* (2013.01); *H01L 2224/16237* (2013.01); *H01L 2224/81801* (2013.01)

(58) Field of Classification Search
CPC ............ H01L 23/5329; H01L 23/5226; H01L 21/76805; H01L 21/76843; H01L 23/49816; H01L 21/76898; H01L 23/49822; H01L 23/4985; H01L 23/481; H01L 24/81; H01L 23/5384; H01L 24/14

See application file for complete search history.

(56) References Cited

U.S. PATENT DOCUMENTS

| | | | | |
|---|---|---|---|---|
| 5,229,550 A * | 7/1993 | Bindra et al. | ................. | 174/262 |
| 5,691,568 A * | 11/1997 | Chou | ............... | H01L 23/49822 257/691 |
| 6,006,428 A * | 12/1999 | Feilchenfeld et al. | .......... | 29/852 |
| 6,169,329 B1 * | 1/2001 | Farnworth et al. | ............ | 257/780 |
| 6,608,376 B1 * | 8/2003 | Liew | ................. | H01L 23/49827 257/690 |
| 6,879,492 B2 * | 4/2005 | Alcoe et al. | .................... | 361/748 |
| 7,015,574 B2 * | 3/2006 | Alcoe | .................... | H01L 23/16 257/690 |
| 7,213,336 B2 * | 5/2007 | Alcoe et al. | ...................... | 29/852 |
| 7,312,103 B1 * | 12/2007 | Huemoeller et al. | ......... | 438/106 |
| 7,937,830 B2 * | 5/2011 | Shioga et al. | ................... | 29/832 |
| 2002/0139578 A1 * | 10/2002 | Alcoe et al. | ................... | 174/262 |
| 2002/0145203 A1 * | 10/2002 | Adae-Amoakoh et al. | ... | 257/778 |
| 2007/0194433 A1 * | 8/2007 | Suwa et al. | ................... | 257/700 |

\* cited by examiner

*Primary Examiner* — Alonzo Chambliss
(74) *Attorney, Agent, or Firm* — Kevin B. Jackson

(57) ABSTRACT

In one embodiment, an electronic package structure includes a substrate having one or more conductive plane layers formed therein. The substrate also includes a plurality of conductive pads on major surface configured to provide electrical interconnects to a next level of assembly. At least one conductive plane layer is configured to have cut-outs above the solder pads so that at least portions of the solder pad are not overlapped by the conductive plane layer.

20 Claims, 7 Drawing Sheets

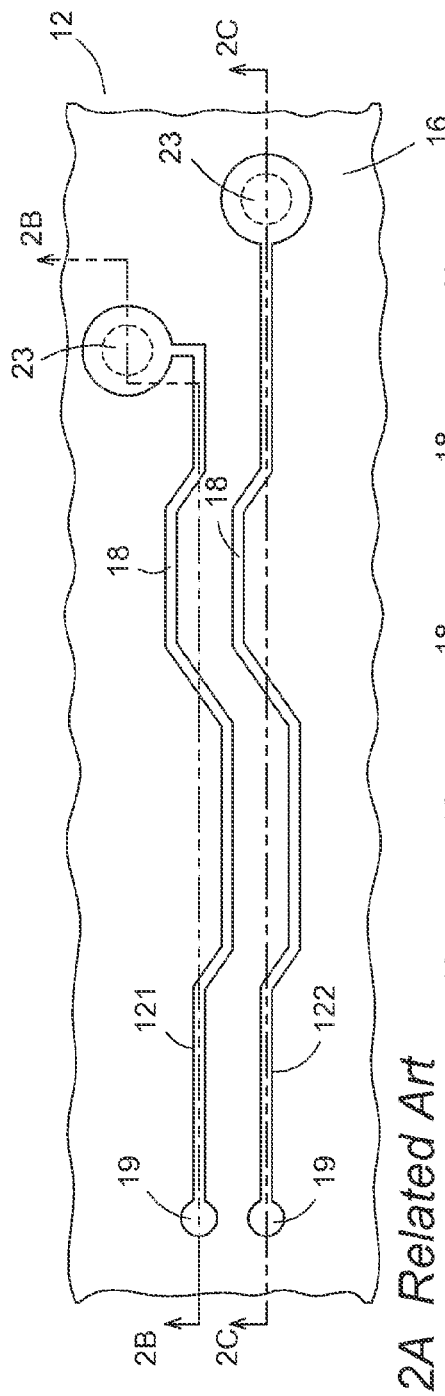
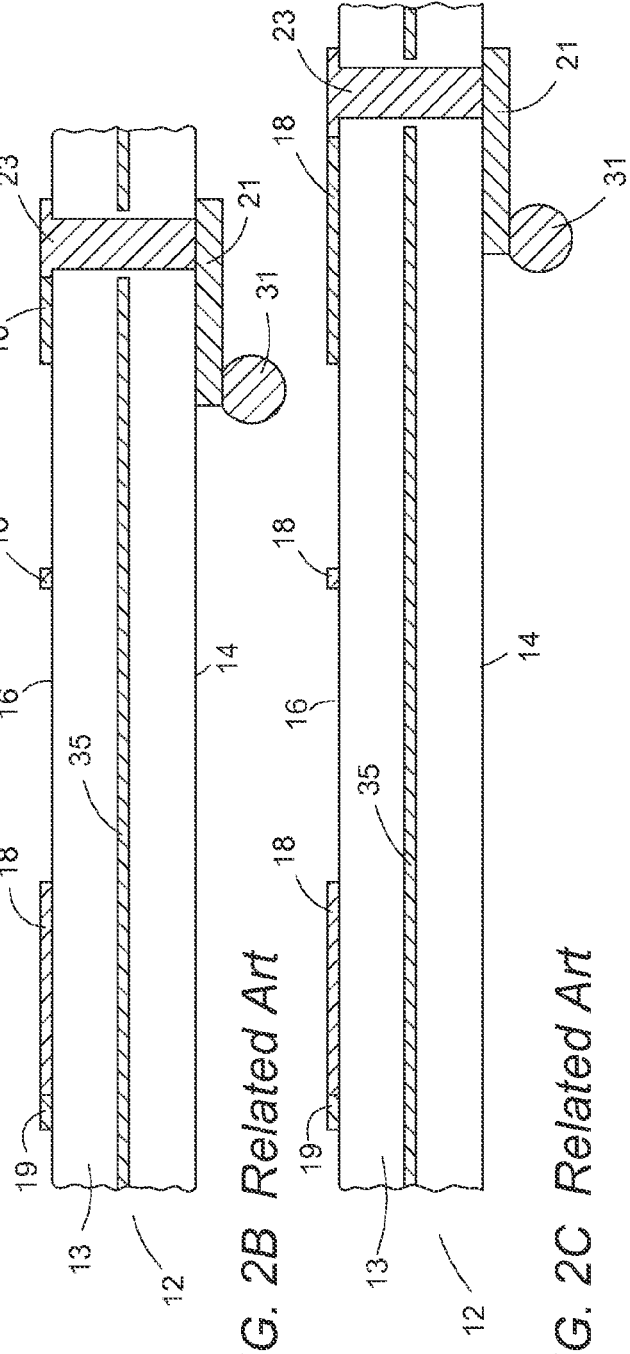
FIG. 2A Related Art
FIG. 2B Related Art
FIG. 2C Related Art

PACKAGE SUBSTRATE STRUCTURE FOR ENHANCED SIGNAL TRANSMISSION AND METHOD

CROSS REFERENCE TO RELATED APPLICATIONS

This application claims the benefit of U.S. Provisional Application No. 61/931,958 filed Jan. 27, 2014.

BACKGROUND

Embodiments disclosed in the present invention relate generally to electrical technology, and more specifically to semiconductors, structures thereof, and methods of forming semiconductor devices.

Semiconductor dies are conventionally enclosed in plastic packages that provide protection from hostile environments and enable electrical interconnection between the semiconductor die and a next level of assembly such as a printed circuit board (PCB) or motherboard. The plastic packages are configured to provide protection of semiconductor die, permit removal of heat generated by the semiconductor die, and permit transmission of electrical signals to and from the semiconductor die.

Ball-grid array (BGA) semiconductor packages are a type of package that uses a laminate substrate, such as a printed circuit board. Depending on the application, the laminate substrate can includes multiple layers of conductive material separated by dielectric layers. The layers of conductive material are patterned to form conductive traces, conductive plane structures (e.g., ground planes and/or power planes), and input/output (I/O) pads, which typically are interconnected with conductive vias. A semiconductor die, such as an integrated circuit, is attached to the laminate substrate with a bonding material and bond wires typically are used to electrically connect pads on the semiconductor die to the conductive traces. Alternatively, the semiconductor die can be attached to the conductive traces or pads on the laminate substrate in a flip-chip configuration. A hard plastic encapsulant material is used to cover the various components and forms the exterior of the semiconductor package, commonly referred to as the package body.

Differential signaling is one known technique for high speed transmission of electrical signals between a packaged semiconductor device and a higher level system. Differential signaling uses two complementary signals sent on two paired wires, called a differential pair. The differential pair technique can be used for both analog signal processing, as in balanced audio as well as digital signal processing, as in RS-422, RS-485, Ethernet over twisted pair, PCI Express, DisplayPort, HDMI, and USB as well as others. In BGA packages, the differential pairs have been implemented with pairs of conductive traces formed on the laminate substrates, and have been implemented using a microstrip or stripline configuration with a dielectric layer separating the differential pairs from one or more conductive plane layers. Certain challenges have existed in achieving good quality high speed signal transfer in semiconductor packages including those that use differential pair configurations. Such challenges have included improving impedance matching, reducing signal reflection and return losses, and maximizing power transfer.

Accordingly, it would be desirable to have a semiconductor package that has improved impedance matching, that reduces signal reflection and return losses, and that maximizes power transfer. It would also be desirable for the semiconductor package to be compatible with existing assembly processes and techniques.

BRIEF DESCRIPTION OF THE DRAWINGS

FIG. 2A is a top view of a portion of the semiconductor package of FIG. 1;

FIG. 2B is a partial cross-sectional view of the semiconductor package of FIG. 2A taken along reference line 2B-2B;

FIG. 2C is a partial cross-sectional view of the semiconductor package of FIG. 2A taken along reference line 2C-2C;

For simplicity and clarity of illustration, elements in the figures are not necessarily drawn to scale, and the same reference numbers in different figures denote generally the same elements. Additionally, descriptions and details of well-known steps and elements are omitted for simplicity of the description. It will be appreciated by those skilled in the art that words, during, while, and when as used herein related to circuit operation are not exact terms that mean an action takes place instantly upon an initiating action but that there may be some small but reasonable delay, such as propagation delay, between the reaction that is initiated by the initial action. Additionally, the term while means a certain action occurs at least within some portion of a duration of the initiating action. The use of word approximately or substantially means a value of an element is expected to be close to a state value or position. However, as is well known in the art there are always minor variances preventing values or positions from being exactly stated.

DETAILED DESCRIPTION OF THE DRAWINGS

Figure 1:
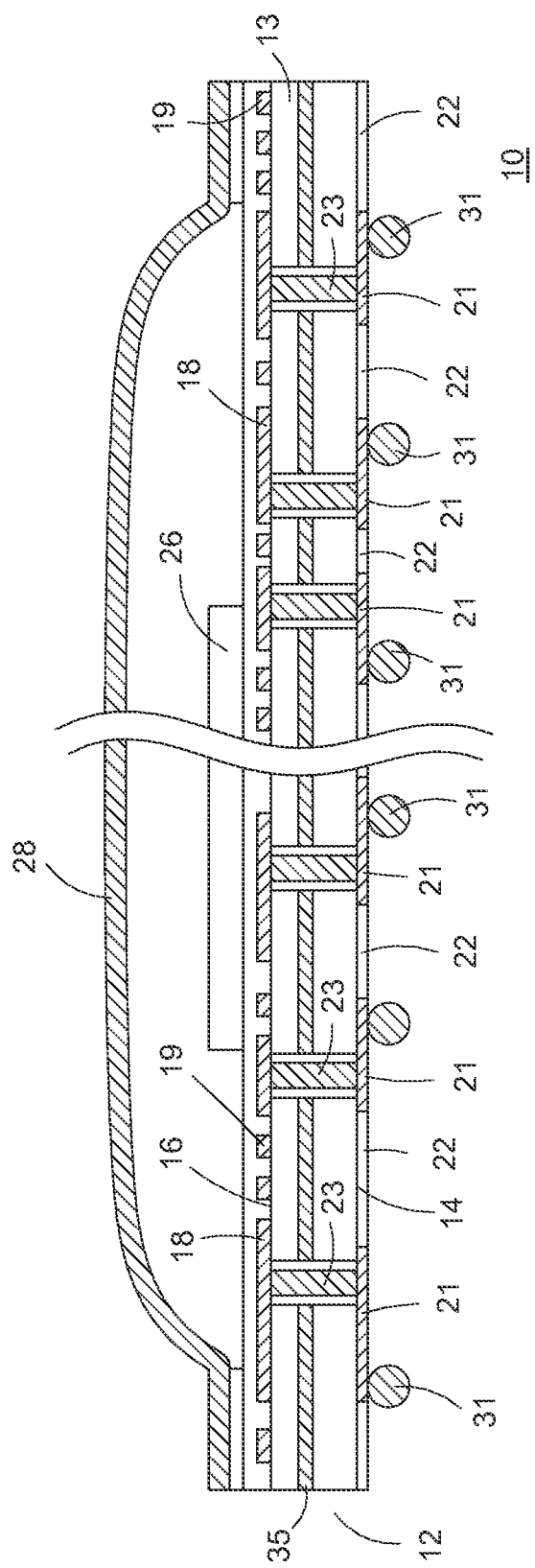
FIG. 1 is a cross-sectional view of an embodiment of a related semiconductor package.

FIG. 1 illustrates a cross-sectional view of a related semiconductor package structure 10 in a BGA configuration. Package structure 10 includes a laminate substrate 12 having opposed major surfaces 14 and 16. A dielectric layer 13 separates major surfaces 14 and 16. Laminate substrate 12 is further illustrated with a conductive plane layer 35 embedded within laminate substrate 12. Conductive traces 18 and pads 19 are formed on major surface 16 and solder pads 21 are formed on major surface 14. Conductive traces 18 are interconnected with solder pads 21 with conductive vias 23. A semiconductor die or chip 26 is attached to major surface 16 and is illustrated in a flip chip attach configuration. A package body 28, such as a protective lid, covers at least portions of major surface 16 and semiconductor chip 26. Conductive solder balls 31 are attached to solder pads 21 on major surface 14 using, for example, solder paste or a conductive epoxy. A solder mask 22 isolates conductive traces 18, conductive pads 19 and solder pads 21.

FIG. 2A shows a partial top view of laminate substrate 12. As shown in FIG. 2A, a differential pair 121 and 122 of conductive traces 118 is formed on major surface 16 and interconnected to solder pads 21 on major surface 14 with conductive vias 23. In certain applications differential pair 121 and 122 of conductive traces 118 is configured as transmit and receive signal lines for high speed data transfer. FIG. 2B is a partial cross-sectional view of laminate substrate 12 taken along reference line 2B-2B of FIG. 2A and FIG. 2C is a partial cross-sectional view of laminate substrate 12 taken along reference line 2C-2C of FIG. 2A. As shown in FIGS. 2B and 2C, conductive plane layer 35 is embedded within dielectric layer 13 in laminate substrate. Conductive vias 23 electrically connect conductive traces 18 on major surface 16 to solder pads 21 on major surface 14. As shown, conductive plane layer 35 overlaps and directly overlies solder pads 21 in laminate substrate 12.

Figure 3:
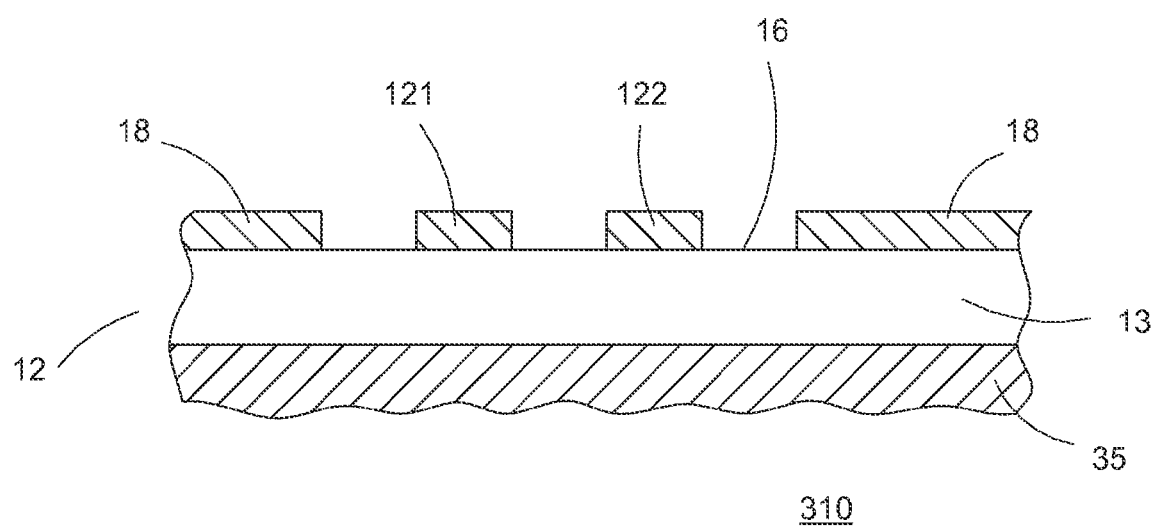
FIG. 3 is a partial cross-sectional view of a micro-stripline configuration.

FIG. 3 illustrates a partial cross-sectional view of laminate substrate 12 with differential pair 121 and 122 of conductive traces formed on major surface 16. FIG. 3 further illustrates laminate substrate 12 with conductive plane layer 35 formed in an internal portion of laminate substrate 12 and separated from conductive traces 121 and 122 by dielectric layer 13. As illustrated, differential pair 121/122 and conductive plane layer 35 are configured as a micro-strip line structure 310. In high speed and high lead count applications it is desirable for the packaged semiconductor device to be configured to have desired impedance matching, to reduce signal reflection and return losses, and to maximize power transfer. Various factors can impact these performance parameters as further described hereinafter.

Figure 4:
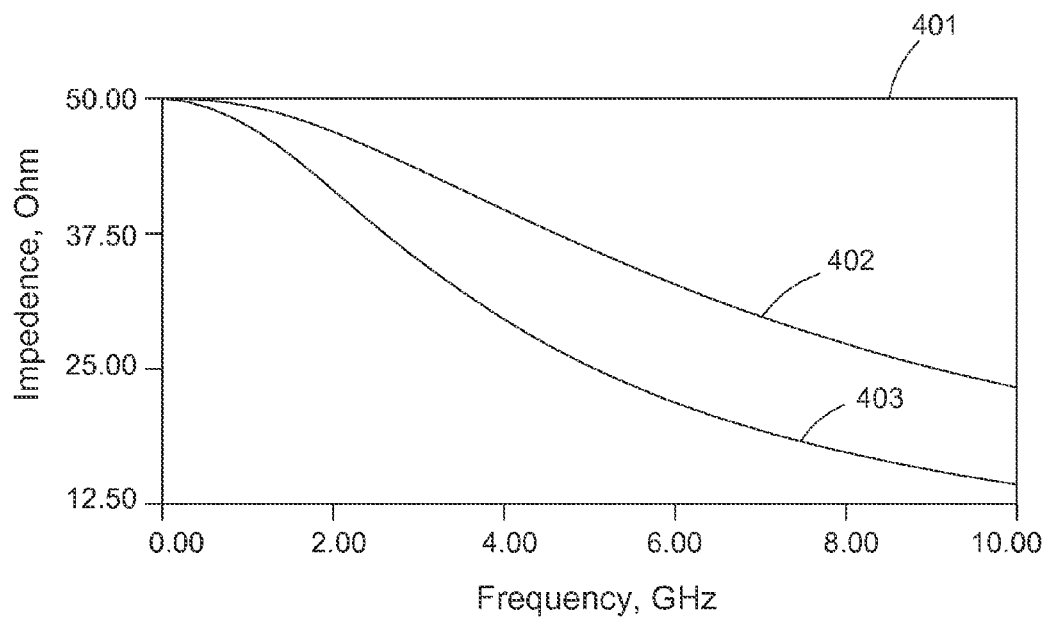
FIGS. 4 and 5 are graphs illustrating performance data for the semiconductor package of FIGS. 1, 2A-2C, and 3.
Figure 5:
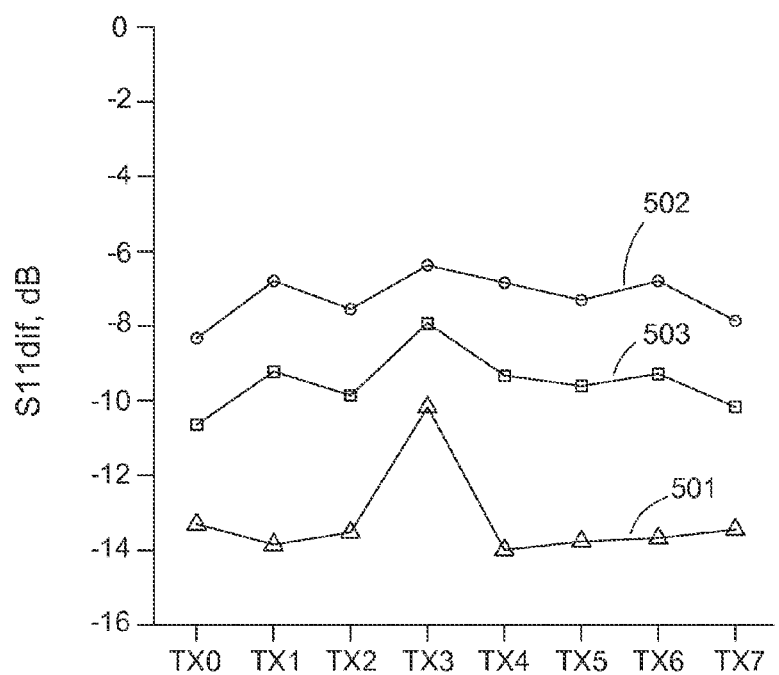

FIGS. 4 and 5 are graphical data for the configuration of FIGS. 1, 2A-2C and 3 illustrating that such designs cannot meet, for example, transmit (TX) differential return loss at 50 Ohm/1.1 pF requirements, which is required for certain high speed data transfer applications such as PCI-Express 2. FIG. 4 is an impedance of loading graph showing impedance as a function of frequency where curve 401 represents a 50 Ohm resistive load, curve 402 represents a 50 Ohm resistive load with a 0.6 pico fared (pF) capacitive load in parallel, and curve 403 represents a 50 Ohm resistive load with a 1.1 pF capacitive load in parallel. This data illustrates that load impedance drops over frequency with an increase in capacitance and points to the importance of package interconnect design to compensate for this frequency variation. FIG. 5 shows that prior packages, such as the package of FIG. 3, can pass the −8 dB of differential return loss within a certain bandwidth if the parallel capacitive loading is less than 0.6 pF (curve 502). However, such packages cannot meet the −8 dB requirement if the parallel capacitance is 1.1 pF (curve 503), which is a reasonable expected and desired value for I/O pad designs. Curve 501 represents a 50 Ohm resistive load only. Thus, prior configurations, such as those of FIGS. 1, 2A-2C, and 3, have been found to be inadequate for high speed data transfer applications.

Transmission line analysis including, among other things, Smith chart studies of the configuration of FIGS. 1, 2A-2C and 3 showed that the configuration required, among other things, an element as a complex conjugate to compensate it. For example, an inductive element greater than about 0.5 nanohenries (nH) would be required. Such an inductor would be difficult to integrate with semiconductor chip 26. Other known techniques to provide tuning with laminate substrate 12, such as varying the width of conductive traces 121 and 122 and/or the thickness of dielectric layer 13 within available design rule limitations were also found not to be capable of meeting the TX differential return loss at 50 Ohm/1.1 pF as well as other requirements. Further analysis by the inventor showed that a low impedance factor in solder pads 21 existed, and that the capacitive effect of solder pads 21 lowered the impedance such that it was difficult to compensate by trace width and dielectric thickness techniques.

Figure 6:
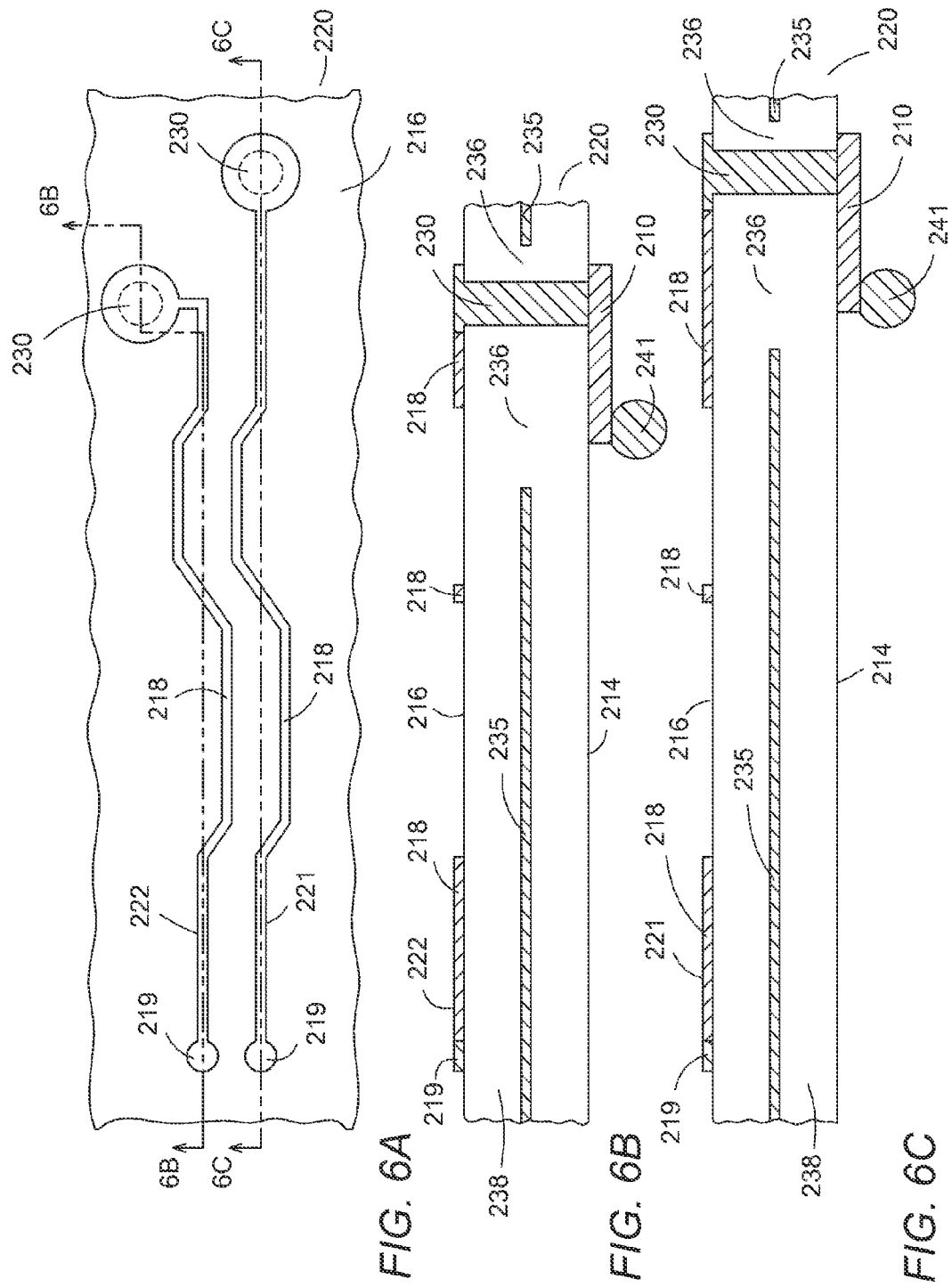
FIG. 6A illustrates a partial top view of a portion of a substrate structure for an electronic package in accordance with an embodiment of the present invention.
FIG. 6B illustrates a partial cross-sectional view of the structure of FIG. 6A in accordance with an embodiment of the present invention taken along reference line 6B-6B.
FIG. 6C illustrates a partial cross-sectional view of the structure of FIG. 6A in accordance with an embodiment of the present invention taken along reference line 6C-6C.

FIG. 6A illustrates a partial top view of a laminate substrate or multiple-layer substrate 220 in accordance with one embodiment. FIG. 6B illustrates a partial cross-sectional view of the structure of FIG. 6A taken along reference line 6B-6B and FIG. 6C illustrates a partial cross-sectional view of the structure of FIG. 6A taken along reference line 6C-6C. In some embodiments, laminate substrate 220 can be a rigid having a fixed shape or form, or a tape substrate that is thin and flexible. Laminate substrate 220 can be composed of a stack of thin layers, and can include materials such as epoxy-based laminates (for example, FR4) or other resin based materials. Laminate substrate 220 includes opposing major surfaces 214 and 216. A plurality of conductive traces 218 and conductive pads 219 are formed on or adjacent major surface 216. In one embodiment, at least some of conductive traces 218 are configured as differential pairs 221 and 222 for transmitting and receiving electrical signals in a high speed data transfer configuration. In one embodiment, elements 221 and 222 work together as a differential pair configuration, structure, connection, or interconnection with a typical 100 Ohm impedance target for at least some applications. In other embodiments, element 221 and/or element 222 alone can work as a single-ended configuration, structure, connection, or interconnection with a typical 50 Ohm impedance target for at least some applications. A plurality of solder pads 210 or conductive pads 210 are formed on major surface 214. In one embodiment, conductive traces 218, conductive pads 219, and solder pads 210 comprise a metal such as copper, a copper alloy, or other materials as known to those of ordinary skill in the art. Conductive traces 218 are in electrical communication with solder pads 210 in the present embodiment using, for example, conductive vias 230, which can be formed by etching vias holes in laminate substrate 220 and filing the holes with a conductive material, such as plated copper.

Laminate substrate 220 further includes one or more conductive plane layers 235 formed between major surfaces 214 and 216. Conductive plane layers 235 can be configured as ground plane layers or power layers, which are separated by dielectric layers 238. In accordance with the present embodiment, a plurality of recesses 236 are formed in conductive plane layers 235 proximate to solder pads 210. In one embodiment, recesses 236 comprise holes extending completely through conductive plane layers 235. It was found that recesses 236 placed proximate to solder pads 210 reduced the capacitive effect between solder pads 210 and conductive plane layers 235, which improved, among other things, the impedance matching for high speed data transfer applications. In accordance with the present embodiment, recesses 236 are formed and substantially aligned with the pattern of solder pads 210 such that at least portions of conductive plane layers 235 do not overlap solder pads 210. In some embodiment, recesses 236 are configured such that conductive plane layers 235 are laterally spaced apart or laterally separated from side portions of solder pads 210. In one embodiment, recesses 236 pass completely through conductive plane layers 235.

Figure 7:
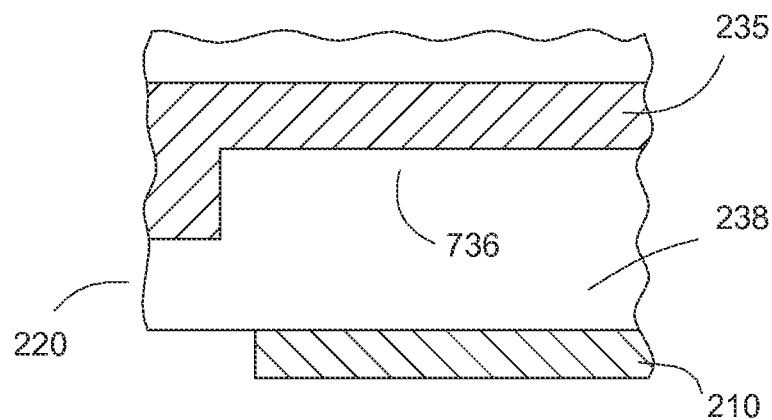
FIG. 7 illustrates a partial cross-sectional view of a portion of a substrate structure in accordance with another embodiment of the present invention.

In an alternative embodiment, plurality of recesses 236 can be areas of conductive layers 235 having reduced thickness to form cavity portions or indentation portions 736 as generally illustrated in FIG. 7. In one embodiment, cavity portions 736 can be formed using a stamping or half-etch processes. In other embodiments, conductive plane layers 235 can be configured with both holes and cavity portions.

Laminate substrate 220 can include multiple conductive plane layers 235. In one embodiment, all of the conductive plane layers 235 are configured with recesses 236 formed approximately above solder pads 210. In another embodiment, only those conductive plane layers 235 closest to solder pads 210 include recesses 236. In one embodiment, recesses 236 can be formed using photomasking and etching techniques to place recesses 236 in a desired pattern. Laminate substrate 220 is further illustrated with a plurality of conductive bumps or solder balls 241 attached to solder pads 210. It is understood that conductive solder balls 241 are optional and that conductive plane layers 235 with recesses 236 can be used with other package interconnect configurations.

Figure 8:
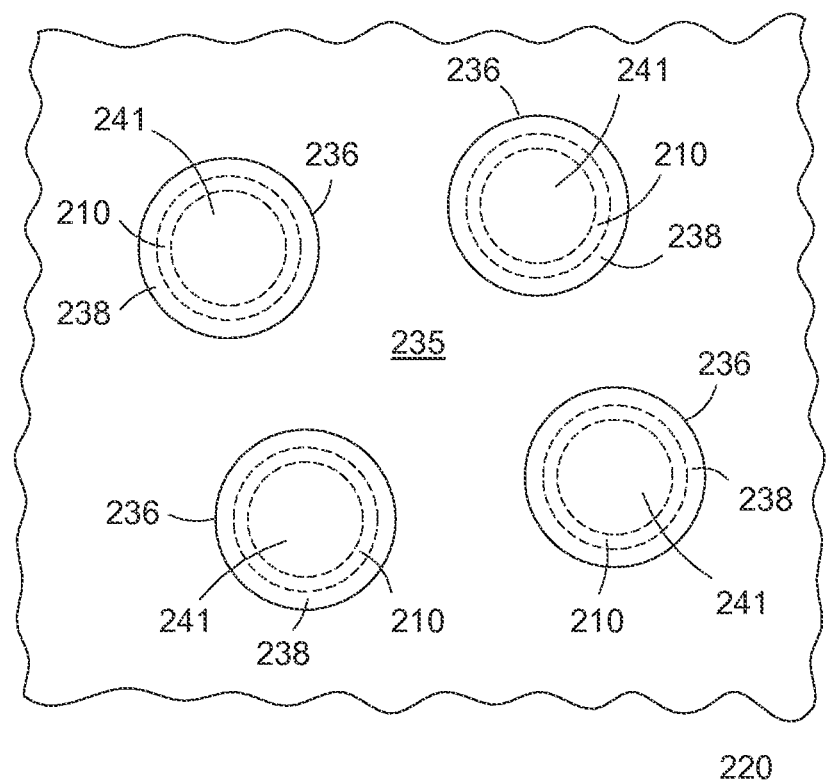
FIG. 8 illustrates a partial top-view of a substrate structure for an electronic package in accordance with an embodiment of the present invention.

FIG. 8 illustrates a partial top view of a portion of laminate substrate 220 looking downward onto conductive plane layer 235. In one embodiment, recesses 236 and solder pads 210 can be configured to have similar shapes. Solder pads 210 are illustrated in phantom because they can be covered or partially covered by dielectric layer 238. Optional solder bumps 241 attached to solder pads 210 are also illustrated in phantom. It is understood that the diameter of solder bumps 241 can be larger or smaller than the diameter of solder pads 210. As illustrated, recesses 236 can be formed at a location within conductive plane layers 235 substantially in alignment with and above solder pads 210. Recesses 236 can have a shape similar to the shape of solder pads 210 or can have a different shape. In one embodiment, recesses 236 have a circular shape as generally illustrated in FIG. 8.

Figure 9:
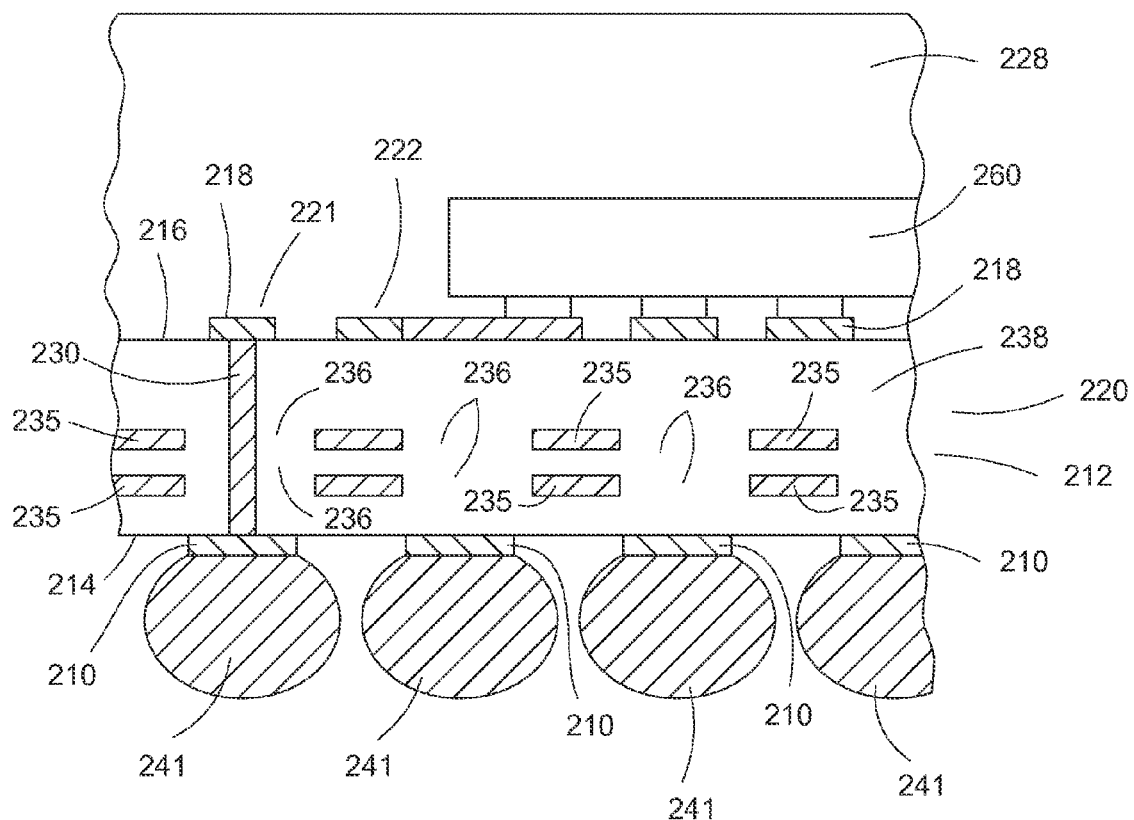
FIG. 9 illustrates a partial cross-sectional view of a semiconductor package structure in accordance with an embodiment of the present invention.

FIG. 9 illustrates a partial cross-sectional view of a packaged semiconductor device 100 in accordance with one embodiment using laminate substrate 220. Device 100 includes laminate substrate 220 having major surfaces 214 and 216. Conductive traces 218 including a differential pair 221/222 are formed on or adjacent to major surface 216. Conductive traces 218 are electrically coupled to solder pads on major surface 214 using, for example, conductive vias 230. One or more conductive plane layers 235 are embedded in laminate substrate 220 and separated from each other by dielectric layer 238. In one embodiment, solder balls 241 are attached to solder pads 210 to provide a BGA configuration. An electronic device such as a semiconductor chip 260 is attached to a major surface 216 and electrically connected to conductive traces 218. The electronic device can be a microprocessor, an application specific integrated circuit (ASIC), a volatile memory, a non-volatile memory, a digital signal processor, a radio frequency circuit, a micro-mechanical systems (MEMS) device, or other electronic device as known to this skilled in the art. It is understood that device 100 can include multiple electronic devices in a side-by-side configuration and/or in a stacked configuration. As illustrated in FIG. 9, at least one solder ball 241 can be substantially vertically aligned with a conductive via 230 with one of solder pads 210 confined inside or within recesses 236.

In the embodiment illustrated, semiconductor chip 260 is attached to laminate substrate 220 in a flip-chip configuration. It is understood that semiconductor chip 260 can be attached to laminate substrate 220 and electrically coupled to conductive traces 218 using conductive wires or other connective structures. A package body 228 covers semiconductor chip 260 and at least portions of major surface 216. In one embodiment, package body 228 includes a molded plastic body. In alternative embodiment, package body 228 can include a protective lid. In accordance with the present embodiment, conductive plane layers 235 are configured to have recesses 236 comprising recesses holes and/or cavity portions 736 (illustrated in FIG. 7) above, overlapping and/or in substantial alignment with solder pads 210. This configuration was found to reduce the capacitive effect between solder pads 210 and conductive plane layers 235, which improved the electrical performance of semiconductor device 100. In one embodiment semiconductor device 100 is configured for High Speed High Lead Count Digital Applications including, for example, PCI-EXPRESS 2 embodiments configured for 5 giga-bits/second (Gb/s) TX/RX speed and Specific Differential Return loss requirements of −8 dB at 2.5 GHz on TX and RX. In one embodiment, conductive plane layers 235 are configured so that no portion of conductive plane layers 235 overlap a solder pad 210. As illustrated, for example, in FIG. 9, at least some of recesses 236 have an edge laterally spaced apart from edges of solder pads 210. In other embodiments, an edge of at least one hole can be laterally spaced apart from an edge of solder pad 210 placed in proximity to the hole. In some embodiments, recesses 236 have a width larger than the width of solder pads 210 proximate to a recess.

Semiconductor device 100 can be manufactured in accordance with the following description. Laminate substrate 220 can be provided having the features described hereinbefore. In one embodiment, laminate substrate 220 can be manufactured in-house. In another embodiment, laminate substrate 220 can be provided by an outside manufacturer. Semiconductor chip 260 can be attached to major surface 216 of laminate substrate 220. In one embodiment, semiconductor chip 260 can be flip-chip attached to pads 219 on laminate substrate using, for example, a conductive solder or a conductive epoxy. In an alternative embodiment, semiconductor chip 260 can be attached to a die pad on major surface 216 and electrically connected to conductive traces 218 using conductive wires (e.g., wire bonds) or other conductive structures. In one embodiment, wire bonding techniques can be used. A package body 228 can then formed to cover or encapsulate semiconductor chip 260 and at least portions of laminate substrate 220.

In one embodiment, molding techniques can be used, such as MAP overmolding or transfer molding techniques. In another embodiment, package body 228 can be a protective lid attached to major surface with an epoxy material or other materials as known to those of ordinary skill in the art. Solder balls 241 can then be attached to solder pads 210 using a conductive solder material or a conductive epoxy material to provide semiconductor package 100 having improved impedance matching, reduced signal reflection and return losses, and improved power transfer performance. One additional advantage of the present embodiment is that laminate substrate 220 can be provided having one or more conductive plane layers 235 with recesses 236 aligned with solder pads 100 as a sub-assembly. Substrate 220 can then be processed to form semiconductor device 210 using existing assembly process techniques, which saves on costs and simplifies implementation.

From all of the foregoing, one skilled in the art can determine that according to one embodiment, a semiconductor package structure (for example, element 100) includes a substrate (for example, element 220) having at least one conductive plane layer (for example, element 235), a plurality of conductive traces on a first major surface (for example, elements 218, 221, 222), and a plurality of solder pads (for example, elements 210) on an opposing second major surface, wherein the at least one conductive plane layer includes a first plurality of recesses (for example, elements 236, 736) in substantial alignment with the plurality of solder pads. A semiconductor device (for example, element 260) is attached to the substrate; and a package body (for example, elements 28, 228) covers at least the semiconductor device.

Those skilled in the art will also appreciate that according to another embodiment, the plurality of conductive traces includes at least one pair of conductive traces (for example, elements 221, 222) configured as a differential pair. In a further embodiment, the at least one conductive plane layer is embedded within the substrate and separated from the plurality of solder pads by a dielectric layer (for example, element 238), the first plurality of recesses comprises a plurality of holes each extending completely through the at least one conductive plane layer, each hole extends completely through the at least one conductive plane layer, and each hole overlaps at least one solder pad. In a still further embodiment, the plurality of solder pads and the plurality of conductive traces can be electrically connected with conductive vias (for example, element 230) each extending through a hole, and an edge of at least one hole is laterally spaced apart from an edge of a solder pad placed in proximity to the at least one first recess. In another embodiment, the substrate can include a second conductive plane layer that includes a second plurality of recesses, wherein at least one second recess overlaps a solder pad and a first recess. In a further embodiment, the differential pair and the at least one conductive plane layer can be configured as micro-strip line structure (for example, element 310). In still further embodiment, the semiconductor device can be attached to the first major surface in a flip chip configuration. In another embodiment, the plurality of solder pads and the plurality of recesses can have similar shapes. In a further embodiment, the structure can further include a plurality of conductive solder bumps (for example, element 241) attached to the plurality of solder pads. In a still further embodiment, the semiconductor device can electrically coupled to plurality of conductive traces using conductive wires. In another embodiment, at least one conductive trace (for example, elements 221, 222) is configured as a single-ended structure, connection, or interconnection.

Those skilled in the art will also appreciate that according to another embodiment, an electronic package structure (for example, element 100) includes a multi-layer substrate (for example, element 220) including a first conductive plane layer embedded therein (for example, element 235) and separated from first and second major surfaces (for example, elements 214, 216) of the multi-layer substrate by dielectric material (for example, element 238), wherein the first conductive plane layer comprises a plurality of first recesses (for example, element 236, 736); a plurality of conductive traces (for example, elements 218, 221, 222) on the first major surface; a plurality of conductive pads (for example, elements 210) on the second major surface, wherein the first plurality of recesses overlaps at least some of plurality of conductive pads; an electronic device (for example, element 260) coupled to the multilayer substrate; and a protective structure (for example, element 28, 228) covering the electronic device.

Those skilled in the art will also appreciate that according to another embodiment, the structure can further include plurality of conductive bumps (for example, element 241) coupled to the plurality of conductive pads. In a further embodiment, each first recess can be laterally spaced apart from edges of each conductive pad. In a still further embodiment, at least one pair of conductive traces is configured as a differential pair (for example, elements 121, 122). In another embodiment, the structure can further include a second conductive plane layer embedded in the multi-layer substrate between the first major surface and the first conductive plane layer, wherein the second conductive plane layer includes a second plurality of recesses overlapping at least some of the plurality of conductive pads. In a further embodiment, the first plurality of recesses can include holes extending completely through the first conductive plane layer so that no portion of the first conductive plane layer overlaps a conductive pad. In a still further embodiment, the structure can further include a plurality of conductive vias (for example, element 230) each electrically coupling a conductive trace to a conductive pad, wherein each conductive via extends through a hole. In another embodiment, the first plurality recesses can include cavity portions (for example, element 736). In a further embodiment, at least one conductive trace (for example, elements 221, 222) is configured as a single-ended structure, connection, or interconnection.

Those skilled in the art will also appreciate that according to still another embodiment, an electronic device package structure (for example, element 100) includes a means for supporting an electronic device (for example, element 220) including at least one conductive plane layer embedded therein (for example, element 235). A first means for transmitting and receiving electrical signals (for example, elements 218, 221, 222) is on a first surface of the means for supporting and second means for transmitting and receiving electrical signals (for example elements 210) is on a second surface of the means for supporting. An electronic device (for example, element 260) is attached to the supporting means and is in electrical communication with the first and second means of transmitting and receiving electrical signals. A package body (for example, elements 28, 228) protects at least the electronic device. The at least one conductive plane layer includes a means for reducing the capacitive effect between the second means for transmitting and receiving electrical signals and the at least one conductive plane layer (for example, elements 236).

Those skilled in the art will also appreciate that according to a further embodiment, a method for forming as packaged semiconductor device (for example, element 100) includes providing a substrate (for example, element 220) having at least one conductive plane layer (for example, element 235), a plurality of conductive traces (for example, elements 218, 221, 222) on a first major surface (for example, element 216), and a plurality of solder pads (for example, elements 210) on an opposing second major surface (for example, element 214), wherein the at least one conductive plane layer includes a plurality of recesses (for example, element 236, 736) in substantial alignment with the plurality of solder pads; attaching a semiconductor device (for example, element 260) to the substrate; and providing a package body (for example, elements 28, 228) covering at least the semiconductor device.

In another embodiment of the method, providing the substrate can include providing a second conductive plane layer having a second plurality of recesses in substantial alignment with the plurality of solder pads. In a further embodiment, providing the substrate can include providing the first plurality of recesses comprising a plurality of holes and providing the plurality of solder pads and the solder pads electrically connected with conductive vias (for example, element 230) each extending through a hole. In a still further embodiment, providing the plurality of conductive traces includes providing at least one pair of conductive traces configured as a differential pair (for example, elements 221, 222). In another embodiment, at least one conductive trace is configured as a single-ended structure, connection, or interconnection.

In view of all the above, it is evident that a novel structure and method is disclosed. Included in one embodiment, among other features, is a laminate substrate having one or more conductive plane layers embedded therein. At least one conductive plane layers includes a plurality of holes extending there through where the conductive plane layer passes over solder pads that are placed on a lower surface of the laminate substrate. The structure and method reduces capacitive effects of the solder pads thereby improving impedance matching, reducing signal reflection and return losses, and improving power transfer performance of packaged electronic devices formed using the laminate substrate. The structure is further compatible with existing assembly process, which saves on cost and eases implementation.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention, and form different embodiments, as would be understood by those skilled in the art.

I claim:

1. A semiconductor package structure comprising:
   a substrate having at least one conductive plane layer, a plurality of conductive traces on a first major surface, a plurality of solder pads on an opposing second major surface, and a plurality of conductive solder bumps coupled to the plurality of solder pads, wherein the plurality of solder pads are electrically coupled with the plurality of conductive traces by a plurality of conductive vias extending vertically from the first major surface to the second major surface, wherein at least one of the plurality of conductive solder bumps is laterally spaced apart from one of the plurality of conductive vias, and wherein the at least one conductive plane layer includes a recess overlapping all of the solder pad having at least one of the plurality of conductive solder bumps laterally spaced apart from one of the plurality of conductive vias;
   a semiconductor device attached to the substrate; and
   a package body covering at least the semiconductor device.

2. The structure of claim 1, wherein:
   the at least one conductive plane layer is embedded within the substrate and separated from the plurality of solder pads by a dielectric layer;
   the recess comprises a at least one hole extending completely through the at least one conductive plane layer; and
   at least one hole overlaps at least one solder pad.

3. The structure of claim 2, wherein:
   an edge of at least one hole is laterally spaced apart from an edge of a solder pad placed in proximity to the at least one hole; and
   at least one conductive trace is configured as a single-ended interconnection.

4. The structure of claim 1, wherein the substrate includes a second conductive plane layer that includes a second recess, wherein the second recess overlaps a solder pad and a the first recess.

5. The structure of claim 1, wherein the plurality of conductive traces includes at least one pair of conductive traces configured as a differential pair.

6. The structure of claim 5, wherein the differential pair and the at least one conductive plane layer are configured as micro-strip line structure.

7. The structure of claim 1, wherein the semiconductor device is attached to the first major surface in a flip chip configuration.

8. The structure of claim 1, wherein the at least one solder pads and the first recess have similar shapes.

9. The structure of claim 1 wherein the recess comprises at least one area of the conductive plane layer having a reduced thickness.

10. An electronic package structure comprising:
    a multi-layer substrate including a first conductive plane layer embedded in the multi-layer substrate and separated from first and second major surfaces of the multi-layer substrate by dielectric material, wherein the first conductive plane layer comprises a plurality of first recesses;
    a plurality of conductive traces on the first major surface;
    a plurality of conductive pads on the second major surface, and a plurality of conductive solder bumps coupled to the plurality of conductive pads, wherein the plurality of conductive pads are electrically coupled with the plurality of conductive traces by a plurality of conductive vias extending vertically from the first major surface to the second major surface, wherein at least one of the plurality of conductive solder bumps is laterally spaced apart from one of the plurality of conductive vias, and wherein at least one of the plurality of first recesses completely overlaps at least one of the plurality of conductive pads having a solder bump that is laterally spaced apart from one of the plurality of conductive vias;
    an electronic device coupled to the multilayer substrate; and
    a protective structure covering the electronic device.

11. The structure of claim 10, wherein each of the plurality of first recesses is laterally spaced apart from edges of each conductive pad.

12. The structure of claim 10, wherein at least one pair of conductive traces is configured as a differential pairs.

13. The structure of claim 10 further comprising a second conductive plane layer embedded in the multi-layer substrate between the first major surface and the first conductive plane layer, wherein the second conductive plane layer includes a plurality of second recesses overlapping at least some of the plurality of conductive pads.

14. The structure of claim 10, wherein the first plurality of recesses comprises holes extending completely through the first conductive plane layer so that no portion of the first conductive plane layer overlaps a conductive pad having a conductive solder bump that is laterally spaced apart from one of the plurality of conductive vias.

15. The structure of claim 14, wherein each of the plurality of conductive vias extends through a hole.

16. The structure of claim 10, wherein the plurality of first recesses comprises cavity portions.

17. A method for forming as packaged semiconductor device comprising:

providing a substrate having at least one conductive plane layer, a plurality of conductive traces on a first major surface, and a plurality of solder pads on an opposing second major surface, and a plurality of conductive solder bumps coupled to the plurality of solder pads, wherein the plurality of solder pads are electrically coupled with the plurality of conductive traces by a plurality of conductive vias extending vertically from the first major surface to the second major surface, wherein at least one of the plurality of conductive solder bumps is laterally spaced apart from one of the plurality of conductive vias, and wherein the at least one conductive plane layer includes at least a first recess overlapping all of the at least one of the plurality of conductive solder pads having a conductive solder bump that is laterally spaced apart from one of the plurality of conductive vias to reduce the capacitive effect between the conductive solder pad and the conductive plane layer;

attaching a semiconductor device to the substrate; and forming a package body covering at least the semiconductor device.

18. The method of claim 17, wherein providing the substrate includes providing a second conductive plane layer having a plurality of second recesses overlapping the plurality of solder pads.

19. The method of claim 17, wherein providing the substrate includes:

providing a third conductive plane layer having a plurality of third recesses overlapping the plurality of solder pads.

20. The method of claim 17, wherein providing the plurality of conductive traces includes providing at least one pair of conductive traces configured as a differential pair.

\* \* \* \* \*